United States Patent [19]
Priore et al.

[11] Patent Number: 6,076,176
[45] Date of Patent: Jun. 13, 2000

[54] ENCODING OF FAILING BIT ADDRESSES TO FACILITATE MULTI-BIT FAILURE DETECT USING A WIRED-OR SCHEME

[75] Inventors: Donald A. Priore, Maynard; Dilip K. Bhavsar, Shrewsbury; Tina P. Zou, Hudson, all of Mass.

[73] Assignee: Digital Equipment Corporation, Houston, Tex.

[21] Appl. No.: 09/044,275

[22] Filed: Mar. 19, 1998

[51] Int. Cl.[7] ............................ G06F 11/20; G11C 29/00; H03M 13/02
[52] U.S. Cl. ............................ 714/710; 714/805; 714/806
[58] Field of Search .................................... 714/710, 805, 714/806, 809, 811; 365/200, 201

[56] References Cited

U.S. PATENT DOCUMENTS

| | | | |
|---|---|---|---|
| 3,898,616 | 8/1975 | Baugh et al. | 340/146.1 |
| 5,103,424 | 4/1992 | Wade | 365/200 |
| 5,495,446 | 2/1996 | Teel et al. | 365/200 |
| 5,572,470 | 11/1996 | McClure et al. | 365/200 |
| 5,862,086 | 1/1999 | Makimura et al. | 365/200 |
| 5,970,003 | 10/1999 | Miyatake et al. | 365/200 |

OTHER PUBLICATIONS

Gieseke, B.A., et al., "A 600MHz Superscalar RISC Microprocessor With Out-of-Order Execution."

Gieseke, B.A., et al., "A 600MHz Superscaler RISC Microprocessor With Out-of-Order Execution," IEEE International Soild-State Circuits Conference, (1997).

Gwennap, L., "Digital 21264 Sets New Standard—Clock Speed, Complexity, Performance Surpass Records, But Still a Year Away," *Microprocessor Report*,10(14):1–11, (Oct. 1996).

Keller, J. et al., "A Superscaler Alpha Processor with Out-of-Order Execution," Microprocessor Forum, (Oct. 1996).

*Primary Examiner*—Stephen M. Baker
*Attorney, Agent, or Firm*—Hamilton, Brook, Smith & Reynolds, P.C.

[57] ABSTRACT

A technique for encoding failing bit addresses in a memory array with redundant portions such as column slices. The address or other identification of a column slice or other portion of a memory array is identified to test logic using a wired-OR bus configuration. The technique assigns a code consisting of predetermined number of asserted bits to each portion of the memory. If a failure condition is detected, the code associated with that portion is asserted onto the bus. Because the code for each memory portion always has a given number of asserted bits, a multi-bit failure situation can be distinguished from a single bit failure situation by counting the number of bits asserted.

13 Claims, 3 Drawing Sheets

| SLICE # | ASSERTED WIRES 12 | "CODE" | | | |
|---|---|---|---|---|---|
| 0 | 100000110 | 8 2 1 | 42 | 110000010 | 8 7 1 |
| 1 | 100001010 | 8 3 1 | 43 | 110000100 | 8 7 2 |
| 2 | 100001100 | 8 3 2 | 44 | 010000110 | 7 2 1 |
| 3 | 000001110 | 3 2 1 | 45 | 110001000 | 8 7 3 |
| 4 | 100010010 | 8 4 1 | 46 | 010001010 | 7 3 1 |
| 5 | 100010100 | 8 4 2 | 47 | 010001100 | 7 3 2 |
| 6 | 000010110 | 4 2 1 | 48 | 110010000 | 8 7 4 |
| 7 | 100011000 | 8 4 3 | 49 | 010010010 | 7 4 1 |
| 8 | 000011010 | 4 3 1 | 50 | 010010100 | 7 4 2 |
| 9 | 000011100 | 4 3 2 | 51 | 010011000 | 7 4 3 |
| 10 | 100100010 | 8 5 1 | 52 | 001100001 | 6 5 0 |
| 11 | 100100100 | 8 5 2 | 53 | 110100000 | 8 7 5 |
| 12 | 000100110 | 5 2 1 | 54 | 010100010 | 7 5 1 |
| 13 | 100101000 | 8 5 3 | 55 | 010100100 | 7 5 2 |
| 14 | 000101010 | 5 3 1 | 56 | 010101000 | 7 5 3 |
| 15 | 000101100 | 5 3 2 | 57 | 001010001 | 6 4 0 |
| 16 | 100110000 | 8 5 4 | 58 | 010110000 | 7 5 4 |
| 17 | 000110010 | 5 4 1 | 59 | 001001001 | 6 3 0 |
| 18 | 000110100 | 5 4 2 | 60 | 001000101 | 6 2 0 |
| 19 | 000111000 | 5 4 3 | 61 | 001000011 | 6 1 0 |
| 20 | 011000001 | 7 6 0 | 62 | 101000001 | 8 6 0 |
| 21 | 101000010 | 8 6 1 | 63 | 111000000 | 8 7 6 |
| 22 | 101000100 | 8 6 2 | 64 | 011000010 | 7 6 1 |
| 23 | 001000110 | 6 2 1 | 65 | 011000100 | 7 6 2 |
| 24 | 101001000 | 8 6 3 | 66 | 011001000 | 7 6 3 |
| 25 | 001001010 | 6 3 1 | 67 | 000110001 | 5 4 0 |
| 26 | 001001100 | 6 3 2 | 68 | 011010000 | 7 6 4 |
| 27 | 101010000 | 8 6 4 | 69 | 000101001 | 5 3 0 |
| 28 | 001010010 | 6 4 1 | 70 | 000100101 | 5 2 0 |
| 29 | 001010100 | 6 4 2 | 71 | 000100011 | 5 1 0 |
| 30 | 001011000 | 6 4 3 | 72 | 100100001 | 8 5 0 |
| 31 | 010100001 | 7 5 0 | 73 | 011100000 | 7 6 5 |
| 32 | 101100000 | 8 6 5 | 74 | 000011001 | 4 3 0 |
| 33 | 001100010 | 6 5 1 | 75 | 000011001 | 4 2 0 |
| 34 | 001100100 | 6 5 2 | 76 | 000010011 | 4 1 0 |
| 35 | 001101000 | 6 5 3 | 77 | 100010001 | 8 4 0 |
| 36 | 010010001 | 7 4 0 | 78 | 000001101 | 3 2 0 |
| 37 | 001110000 | 6 5 4 | 79 | 000001011 | 3 1 0 |
| 38 | 010001001 | 7 3 0 | 80 | 100001001 | 8 3 0 |
| 39 | 010000101 | 7 2 0 | 81 | 000000111 | 2 1 0 |
| 40 | 010000011 | 7 1 0 | 82 | 100000101 | 8 2 0 |
| 41 | 110000001 | 8 7 0 | 83 | 100000011 | 8 1 0 |

FIG. 3

ENCODING OF FAILING BIT ADDRESSES TO FACILITATE MULTI-BIT FAILURE DETECT USING A WIRED-OR SCHEME

FIELD OF THE INVENTION

This invention relates generally to memory components for use in data processing systems and in particular to a technique for encoding addresses.

BACKGROUND OF THE INVENTION

Present day memory components such as random access memories (RAM) have become widely available in densities that are much greater than that envisioned only a few years ago. By today's standards, even relatively small memory arrays contain hundreds of thousands or even millions of individual storage cells. The possibility of having one or more defective cells must therefore be assumed by the designer as the size of a memory increases.

It is now commonplace to include circuitry within a memory which can not only detect when a cell has failed but also to replace the failed cell with an operating cell. This capability is even more important in certain applications such as on-chip memory. It would be extremely cost inefficient to have to discard an entire integrated circuit chip because of the failure of a single memory cell in a memory.

In order to provide a repairable memory array, it is common for such memories to be logically divided into segments whereby the segments are independently testable and repairable. Each of the segments may be organized as a set of column clusters and a selectable spare column cluster or slice.

In order to repair a particular segment, it is first necessary to determine which particular cell or bit has failed within it. During a built-in-self-test procedure, each such column returns a data bit value for each test cycle. By examining the data bit value against an expected value, a bit failure can be determined. In the case of a mis-match between the expected value and the actually returned value, the column which provided the bad bit can be identified using the bit position of the failed bit. The failed column can then be replaced by the spare column.

Because of the possibility of more than one column slice failing, the test logic also preferably determines when more than one bit has failed in a given test cycle. This is important because when this condition exists, the memory is in a failure mode which cannot be repaired by a single column slice replacement. In such an instance, a row replacement may have to be made instead.

There are a number of ways to determine the identity of multiple failed columns. One technique would be to run a wire to the test logic for each column and for every segment. This technique is perhaps the most straightforward and works well if there are no more than a few column slices and segments. This is not a problem typically, for example, in a single bit wide array. However, this technique becomes more problematic in cache memories, which may contain data words that are sixty-four, or more bits wide.

Another way is to run a set of wires, such as in a wired-OR bus configuration with a unique non-empty set of wires being asserted to indicate an address for a failed cluster. The number of wires thus required is the smallest integer, N, such that $2^N$ is greater than the number of column clusters under test. In general, however, such a scheme would not allow detection of a multi-column failure, since the logical OR of the addresses of two or more failed clusters may map to the address of a third, unrelated cluster.

A type of column identification scheme can also be used to indicate a multi-bit failure. In particular, a separate multi-bit failure detection circuit may be included as part of the wired-OR bus used to provide the address of the failing column. For example, if the memory array contains a 64 bit wide data path, the columns can be divided into eight "chunks", having eight bits. Within chunk, eight wires can be run with one wire associated with each column, e.g., with each bit of the data path. Logic within each column then asserts its corresponding wire if its respective bit mismatches. The logic performs a logical AND operation of each wire with a logical OR operation of the remaining seven wires. The result is then used to pull down a ninth wire which runs across the entire data path in a wired-OR configuration. This ninth wire therefore operates as a partial multi-bit failure detector, because it is pulled down only when a multi-bit failure is detected within one of the chunks of eight. It does not, however detect all possible multi-bit failure situations. In addition, the scheme requires that each chunk of eight bits have a dedicated wire running across at least half of its data path to accommodate the wired-OR pull downs at each bit position within a chunk.

A double level scheme can be implemented in which an AND of each of the wires provided by each chunk is performed with a logical OR of the remaining seven. A subsequent OR of the eight AND operations indicates a multi-bit failure by virtue of a failure in more than one chunk. Other schemes with smaller chunk sizes can also be imagined.

However, all of these schemes require additional data path wires and associated logic which in turn requires significant area and penalties in terms of delay before the error detection operation is complete. They may also complicate the layout of components within the data path, since the address logic for each segment is different, depending upon its position in the array.

SUMMARY OF THE INVENTION

The present invention eliminates the complexities of the individual multiple failing bit wire and chunk schemes described above. In particular, the invention is a technique for encoding the failing bit address of a column slice onto a wired-OR bus configuration that permits a multi-bit failure to be distinguished from a single bit failure.

In particular, the invention encodes the failing bit address or code of a memory column slice in such a way as to guarantee that the bit-wise logical OR of any two or more failing bit codes does not map to the failing bit code of some other slice. This is preferably achieved by requiring that each failing bit code have exactly the same number of bits asserted or pop count. In other words, the test logic within each bit slice of the data path is required to pull down a specified number of wires when a mis-match is detected.

The control logic for the array can then determine the relevant case, that is, a single bit failure or a multi-bit failure, by counting the number of asserted bits on the delivered code.

If it is zero, then there was no error.

If it is exactly the specified number, then exactly one bit has failed and the address of the failed column slice is given by the code.

If the number of asserted bits is greater than the specified number, then a multi-bit failure has been detected, and the exact code is meaningless.

Because a multi-bit failure code is a bit wise OR of its associated single bit codes, and because the single bit codes are themselves unique, all multi-bit failure modes always result in a greater number of bits being asserted than the number of bits asserted for valid single bit failure codes.

In general, such a coding scheme requires only a few additional wired-OR bus wires than a conventional binary address scheme. For example, a memory array with eighty-four repairable slices requires seven wires to implement the conventional addressing scheme. However, according to the invention, assigning each segment a code with pop count of three requires only nine wires.

The invention also provides an advantage to the circuit designer since layout of the memory segments is much simpler. In particular, the number of pull down circuits and the number and size of the bus driver circuits, is the same for all slices. The invention also does away with a need for combinatorial logic to detect multi-bit failures. This reduces the area, logic delay, and design complexity as related to conventional approaches.

The invention may have more general applicability wherever there is an instance of requiring more than one agent to drive a signature onto a wired-OR bus and the identity of one of the agents must be detected with the possibility that more than one agent may assert its identity at the same time.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3 is a chart of codes that uniquely identify the address of a failed slice.

DETAILED DESCRIPTION OF A PREFERRED EMBODIMENT

Figure 1:
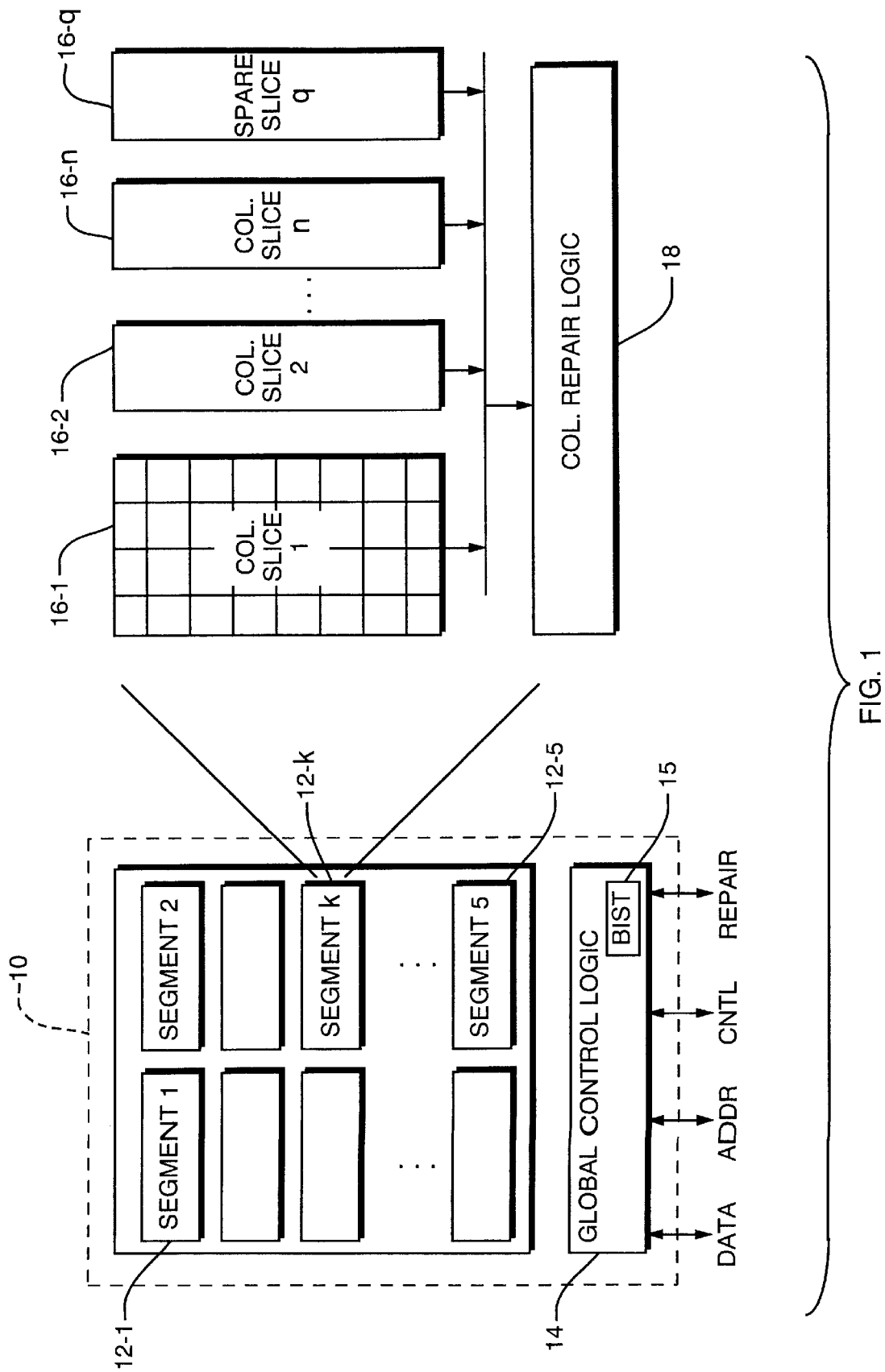
FIG. 1 is a block diagram illustrating the organization if a memory array that uses column repair logic.

Turning attention now to FIG. 1, there is shown a memory array 10 which makes use of a failing bit identification scheme with multi-bit failure detection capability according to the invention. The memory array 10 consists of a number of segments 12-1, 12-2, ..., 12-k, ..., 12-s, with the exact number of segments 12 depending upon the number of bits required to be stored by the memory array 10. Data (DATA), address (ADDR), control (CNTL), and repair (REPAIR) signal paths pass to a global control circuit 14 to operate the memory array 10 in accordance with known techniques. For example, the global control circuit 14 passes along built-in-self-test (BIST) signals to each of the segments 12. This BIST logic 15, for example, compares data read from a segment 12 and compares it with expected data to produce information needed to identify a failure of the array 10.

Each segment 12, as shown in the more detailed view of a particular segment 12-k, is independently repairable by a spare column slice. In particular, the segment 12-k consists of a number of column slices 16-1, 16-2, ..., 16-n, and a spare column slice 16-q. The number of column slices 16 within a given segment 12-k depends upon the particular desired configuration of the memory array 10.

Each column slice 16 is, in effect, a one bit wide memory. Therefore, the number of column slices in each segment typically depends upon the desired word size of the memory array 10. For example, in an 84 bit wide instruction cache application for the memory array 10 there may be as many as eighty-four column slices 16-1, 16-2, ..., 16-84 plus the spare slice 16-q in each segment 12.

Repair logic signals are passed between the global control circuit 14 to column repair logic 18 within each segment 12. Built-in-self-test logic 15 within the global control logic circuit 14 periodically generates address, data, and control signal sequences corresponding to particular memory testing algorithms. Such test sequences determine and maintain up-to-date failure information that becomes the basis for repairing the individual segments 12-k. For example, upon detection of a failing bit within one of the column slices 16-i, the column repair logic 18 provides a repair address for the spare slice 16-q and disables the bad column slice 16-i.

The present invention relates to a technique for encoding the addresses of the individual column slices 16 in the built-in-self-test procedure to minimize the number of additional logic circuits and/or wires required for identification of the failing column slice 16-i.

Figure 2:
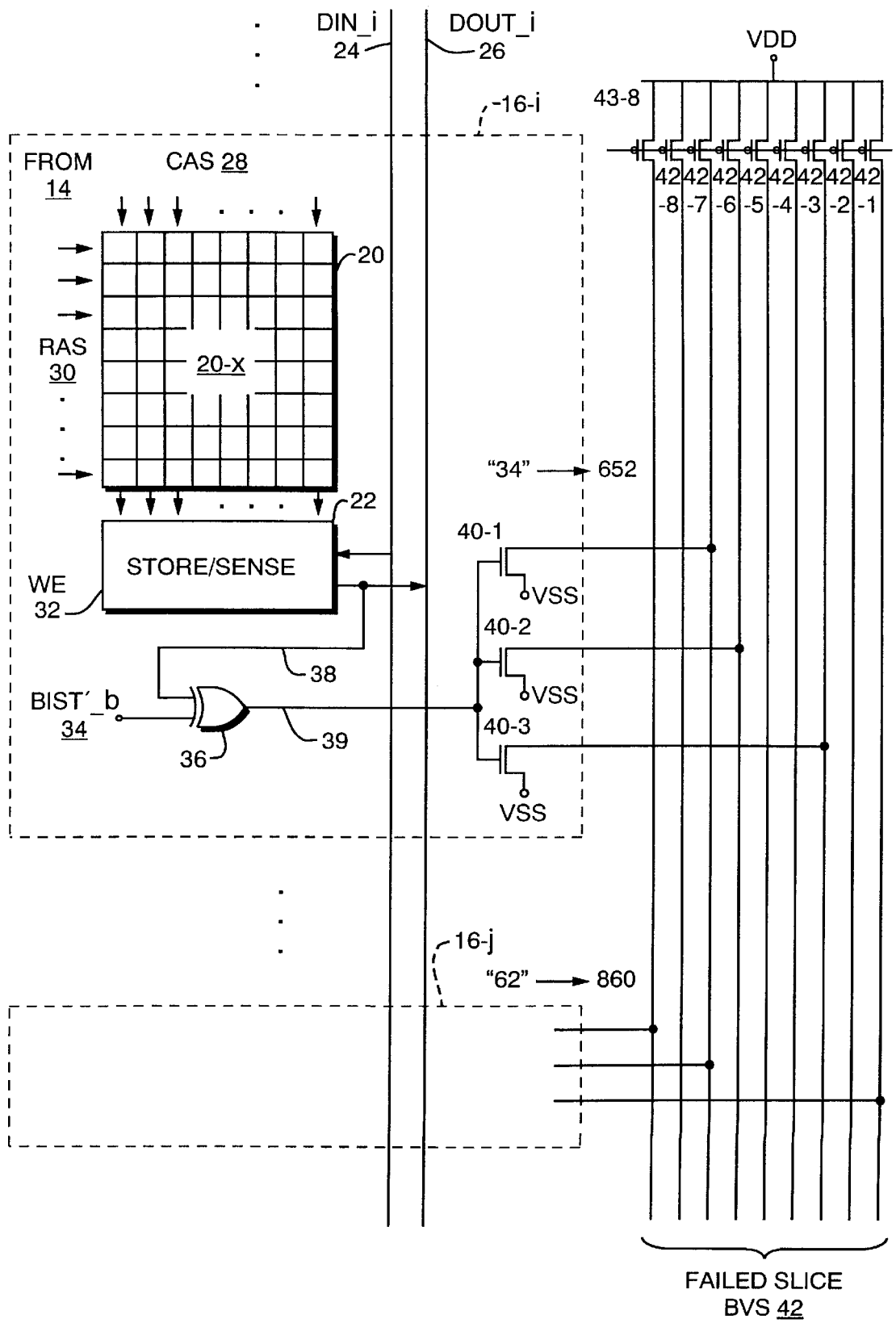
FIG. 2 is a more detailed circuit diagram of column repair logic which makes use of the invention.

The particular manner of implementing the invention can be understood by referring now to FIG. 2, in which is shown a detailed circuit diagram of an exemplary column slice 16-i. The column slice 16-i consists of a memory cell storage array 20, store and sense circuits 22, test comparator 36, and slice identifier transistors 40-1, 40-2, 40-3.

In operation, the storage array 20 performs as in the prior art. Specifically, although the column slice 16-1 appears as a single column of bits to the memory array 10, it is common to arrange each column slice as a two dimensional array 20 of storage cells. The array 20 is addressable by column address strobe 28 and row address strobe 30 signals as is well known in the art.

A data in signal DIN-i 24 and data out signal DOUT-i 26 are connected to the DATA bus in the global control logic 14. The store sense logic 22, responsive to a write enable signal 32, provides for reading or writing of the individual storage cells of the array 20 as selected by the row address strobe 30 and column address strobe 28 signals. The column address strobe 28 and row address strobe 30 are derived from the address inputs ADDR provided by the global control logic 14. The operation of the array 20 is conventional and it is therefore not necessary to describe it further here.

Also in accordance with known techniques, the built-in-self-test circuit 15 periodically provides a test signal BIST-i 34 to the comparator 36. This built-in-self-test signal provides a signal indicative of the data which is expected to be contained in one of the storage cells 20-x in the array 20. Upon being read out, the actual contents of the storage cell location 20-x under test are fed on a wire 38 to the other input of the comparator 36 which may, for example be an exclusive-OR logic gate. The comparator 36 in turn provides test result signal 39 indicative of whether the cell under test 20-x contained the expected value. For example, when the values match, the comparator 36 output is deasserted or a logic 0. However, when there is a difference, then the output is asserted, or a logic 1, indicating an error.

The comparator output is in turn used as a test comparison result signal 39 to assert a pre-defined code for the particular failed column slice 16-i onto the failed slice bus 42. As is shown in the figure, the failed slice bus 42 in the illustrated embodiment contains nine bus wires 42-0, 42-1, ..., 42-8. Each of the respective bus wires is arranged in a wired-OR configuration such that it is pulled up to a Vdd voltage level by a respective one of the pull up PMOS transistors 43-0, 43-1, ..., 43-8.

Also in accordance with the invention, a particular failing bit code is associated with each of the slices 16-$i$. The failing bit code of each slice 16-$i$ is selected in such a way as to guarantee that the results of the bit wise logical OR of the code for a failed slice is such that in the event that two or more of the slices 16 fail at the same time, the resulting code on the failed slice bus 42 does not map to the failing bit code of some other bit slice.

This is achieved, for example, by assigning a failing bit code to each slice 16-$i$ which has exactly the same number of asserted wires as the codes for other slices 16. In the particular example shown in FIG. 2, the slice 16-$i$ has been assigned the code 652, which means that upon a failure as indicated by assertion of the test comparison signal 39 the wires 42-6, 42-5, and 42-2, will be asserted on the failed slice bus 42. The failed slice bus 42 pulls up all of the associated wires 42-0, . . . , 42-8 to an unasserted or logic 0 state in the normal operation in which no slice 16 has failed. Upon a failure of the slice 16-$i$, the asserted signal 39 activates the pull down transistors 40-1, 40-2, and 40-3 associated with the slice 16-$i$. This in turn causes the wired-OR bus wires 42-6, 42-5 and 42-2 connected to these transistors to be pulled down to a logic low state.

However another slice 16-$j$ which may, for example, correspond to bit number 62 of the array 10, is assigned a failing bit code of 860. Thus, if slice 16-$j$ fails, it will cause the wires 42-8, 42-6, and 42-0 to be asserted.

By stipulating that the code of a given column slice 16-$i$ has a failing bit code having exactly the same number of bits as the code assigned to any other failed slice 16, the test logic within the built-in-self-test 15 may determine whether a single slice has failed, or if multiple slices have failed. In other words, the test logic within each bit slice always pulls down the same number of wires when a mismatch is detected. Because the multi-bit failure situation therefore asserts a state on the failed slice bus 42 which is the bit wise logical OR of its constituent single bit codes, and because all single bit codes are themselves unique, all resulting multi-bit failure states therefore have a greater number of bits set (or wires asserted) than the class of valid single bit codes.

Therefore, the control logic 14 may determine the relevant case, that is either (i) no failures, (ii) a single bit failure or (iii) a multi-bit failure, by doing a pop count on the code delivered by the failed slice bus 42 for the segment 12-$k$ under test.

If the code is 0, there was no error.

If the code contains exactly the specified number of asserted bits, then only one slice failed and the address of the failed slice is given by the code.

If the code received contains greater than the specified number of asserted bits, then a multi-bit failure situation is detected. The exact code for a column slice is meaningless in this situation, that is, a single column repair alone will not effect a complete repair of the failed segment 12-$k$.

A chart of the codes which may be associated with a segment 12-$k$ having eighty-four column slices 16 and a pop count of three is shown in FIG. 3. For each entry in the chart, the leftmost column indicates an index number of a particular one of the column slices 16. The second column indicates which of the nine wires are asserted on the bus 42. The third column indicates a code which maps to the index number of the asserted wire for the corresponding slice. For example, the code "652" is used to indicate slice number 34, i.e. column slice 16-34, as previously described.

The invention also provides an advantage to the circuit designers since the layout of the segments 12-$k$ is greatly simplified. In particular, the number of pull down transistors is the same in each slice 16-$i$. Therefore, the number of driver circuits is the same for all bits across all slices and segments 12.

Furthermore, the invention also eliminates the need for a specific combinatorial logic to detect multi-bit failures within each slice 16-$i$, such as might be necessary with schemes that group slices together in "chunks".

Each of these above features also reduces the physical area required for logic delay and design complexity as relating to previously used approaches.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A process for identifying a failed column slice within a memory array having one or more column slices, each column slice containing an array of storage cells corresponding to a bit column of the memory array, the process comprising the steps of:

(a) detecting the occurrence of at least one bit error in a column slice; and (b) forwarding a failing bit code to the segment repair logic for a column slice in which an error is detected, the failing bit code assigned to each slice such that the segment repair logic can determine if more than one column slice has failed at the same time by examining the returned failing bit code.

2. A process as in claim 1 wherein the step of forwarding a failing bit code further comprises the step of:

asserting the failing bit code onto a wired-OR data bus connected between the column slices and the segment repair logic.

3. A process as in claim 1 wherein the failing bit code assigned to each slice has the same predetermined number of asserted bits as the failing bit codes assigned to the other slices.

4. A process as in claim 3 additionally comprising the step of:

(c) determining whether a single column slice has failed by determining whether the number of asserted bits on the wired-OR data bus is the same as the predetermined number.

5. A process as in claim 3 additionally comprising the step of:

(c) determining whether multiple column slices have failed by determining whether the number of asserted bits on the wired-OR data bus is greater than the predetermined number.

6. A process for identifying a failed portion of a memory comprising the steps of:

(a) assigning a failing bit code to each portion of the memory, the failing bit code for each portion having the same predetermined number of asserted bits as the failing bit codes assigned to other portions of the memory;

(b) upon a failure of at least one storage cell within a memory portion, asserting the failing bit code assigned to the portion onto a common wired-OR bus connected between multiple portions of the memory; and (c) counting a total number of bits asserted onto the common wired-OR bus to determine whether no portion has failed, whether a single portion has failed, or whether multiple portions have failed.

7. A memory for use with a data processing system comprising:

(a) a plurality of repairable segments, each segment including a number of slices corresponding to a portion of the memory, and each segment also including at least one spare slice used to replace a failed slice;

(b) error detection logic associated with each slice, the error detection logic asserting an error signal upon detection of an error condition in the respective slice; and (c) a failed slice identifier for each slice, connected to receive the error signal in its respective error detection logic, and asserting a failing bit code identifying the slice, such that it can be determined whether more than one slice has failed at the same time by examining the number of asserted bits of returned failing bit code.

8. A memory as in claim 7 additionally comprising:

(d) repair logic, connected to receive the failing bit codes asserted by the failed slice identifiers, for determining the identity of a failed slice.

9. A memory as in claim 8 wherein the failed slice identifiers additionally comprise a circuit for asserting the failing bit code onto a wired-OR data bus connected between the slices and the repair logic.

10. A memory as in claim 9 wherein the failing bit code assigned to each slice has the same predetermined number of asserted bits as the failing bit codes assigned to the other slices.

11. A memory as in claim 10 wherein the repair logic additionally determines whether a single slice has failed by determining whether the number of asserted bits on the wired-OR data bus is the same as the predetermined number.

12. A memory as in claim 10 wherein the repair logic additionally determines whether multiple slices have failed by determining whether the number of asserted bits on the wired-OR data bus is greater than the predetermined number.

13. A memory as in claim 7 wherein the slices are bit column slices.

* * * * *